United States Patent
Chang et al.

(10) Patent No.: US 10,367,330 B2
(45) Date of Patent: Jul. 30, 2019

(54) DIFFUSER, LASER-LIGHT-SOURCE MODULE USING THE SAME, AND METHOD FOR MANUFACTURING THE SAME

(71) Applicant: DELTA ELECTRONICS, INC., Taoyuan (TW)

(72) Inventors: Keh-Su Chang, Taoyuan (TW); Chun-Hsien Lu, Taoyuan (TW); Yen-I Chou, Taoyuan (TW); Chi Chen, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 15/219,304

(22) Filed: Jul. 26, 2016

(65) Prior Publication Data
US 2017/0264072 A1   Sep. 14, 2017

(30) Foreign Application Priority Data
Mar. 11, 2016   (TW) .............................. 105107455 A

(51) Int. Cl.
*H01S 5/00*   (2006.01)
*G02B 5/02*   (2006.01)

(52) U.S. Cl.
CPC .......... *H01S 5/0064* (2013.01); *G02B 5/0215* (2013.01); *G02B 5/0268* (2013.01); *G02B 5/0278* (2013.01); *G02B 5/0294* (2013.01); *H01S 5/005* (2013.01)

(58) Field of Classification Search
USPC ................................ 362/227, 246, 259, 558
See application file for complete search history.

(56) References Cited

U.S. PATENT DOCUMENTS

| | | | |
|---|---|---|---|
| 7,806,567 B2 | 10/2010 | Chen | |
| 2011/0310487 A1* | 12/2011 | Nagahama | E06B 9/24 359/599 |
| 2012/0080710 A1* | 4/2012 | Inoue | G02B 5/045 257/98 |
| 2014/0009834 A1* | 1/2014 | Kalyankar | G02B 1/115 359/586 |

FOREIGN PATENT DOCUMENTS

| | | |
|---|---|---|
| CN | 1928657 A | 3/2007 |
| CN | 101493536 A | 7/2009 |
| CN | 102444862 A | 5/2012 |
| TW | 520445 B | 2/2003 |
| TW | 200508726 A | 3/2005 |
| TW | 200526995 A | 8/2005 |
| TW | 200636358 A | 10/2006 |

* cited by examiner

*Primary Examiner* — Matthew Mikels
(74) *Attorney, Agent, or Firm* — CKC & Partners Co., LLC

(57) ABSTRACT

A diffuser includes a first substrate and a gel layer. The first substrate has a first refractive index n1. The gel layer includes a body and at least one microstructure. The body is disposed on the first substrate. The microstructure is disposed on the body, wherein the dimension of the microstructure is smaller than that of the body. The body is located between the microstructure and the first substrate. The gel layer has a second refractive index n2, and n1>n2.

14 Claims, 5 Drawing Sheets

DIFFUSER, LASER-LIGHT-SOURCE MODULE USING THE SAME, AND METHOD FOR MANUFACTURING THE SAME

RELATED APPLICATIONS

This application claims priority to Taiwanese Application Serial Number 105107455, filed Mar. 11, 2016, which is herein incorporated by reference.

BACKGROUND

Technical Field

The present disclosure relates to a diffuser, a laser-light-source module using the same, and a method for manufacturing the same.

Description of Related Art

In recent years, laser sources have been applied in various fields. For example, the laser source can be applied to illumination and display. By modulating the laser light source, it can be applied to consumer electronic products, for example, optical projectors.

In addition, in the application in which the laser light source modulation, since a laser light beam provided by the laser light source can be converged to be a smaller light spot, the laser light beam can have a high irradiance. On the other hand, with respect to different demands, the laser light beam provided by the laser light source can have a diffusing angle through a diffuser, such that the laser light source can be further applied to, for example, spotlights, headlights, projectors or flat panel display technology. However, once the diffused laser light beam is set to be a small angle, the technology for manufacturing such a diffuser would become a challenge.

SUMMARY

An aspect of the present disclosure is to provide a diffuser including a laser light source and a diffuser. The diffuser includes a gel layer, in which a laser light beam can be diffused by microstructures of the gel layer. In addition, the diffusing angle of the laser light beam can be adjusted by the configuration of the refractive indexes of layers in the diffuser, such that the diffusing angle of the laser light beam can be set to satisfy a predetermined condition. With the configuration of the refractive indexes of layers in the diffuser, the microstructures of the gel layer can be allowed to have the greater roughness range, such that the processes for manufacturing the microstructures of the gel layer of the diffuser can be simplified, thereby reducing the manufacturing cost of the diffuser.

An aspect of the present disclosure is to provide a diffuser including a first substrate and a gel layer. The first substrate has a first refractive index n1. The gel layer includes a body and at least one microstructure. The body is disposed on the first substrate. The microstructure is disposed on the body, in which the dimension of the microstructure is smaller than the dimension of the body. The body is located between the microstructure and the first substrate. The gel layer has a second refractive index n2, and n1>n2.

In some embodiments, the diffuser further includes a first anti-reflection layer disposed on the first substrate, in which the first substrate is located between the first anti-reflection layer and the gel layer.

In some embodiments, a relationship between the first refractive index n1 and the second refractive index n2 is n1>n2>(n1+1)/2.

In some embodiments, the diffuser further includes a second substrate, in which the gel layer is located between the first substrate and the second substrate.

In some embodiments, the first substrate and the second substrate have substantially the same refractive index.

In some embodiments, the second substrate has a concave-convex surface facing toward the microstructure of the gel layer, and the microstructure of the gel layer is filled into the concave-convex surface of the second substrate.

In some embodiments, the first substrate has a concave-convex surface facing toward the gel layer. The gel layer includes a plurality of the microstructures. One part of the microstructures is filled into the concave-convex surface of the first substrate, and another part of the microstructures is filled into the concave-convex surface of the second substrate.

In some embodiments, the diffuser further includes a second anti-reflection layer, in which the second substrate is located between the second anti-reflection layer and the gel layer.

In some embodiments, the diffuser further includes a second anti-reflection layer, in which the second anti-reflection layer is located between the second substrate and the gel layer.

In some embodiments, the first substrate is made of an inorganic material including at least one of the group of silicon oxide, glass, quartz, calcium fluoride and sapphire, and the gel layer is made of an organic material including at least one of the group of polysiloxanes and silicone.

In some embodiments, the body and the microstructure of the gel layer are formed integrally.

An aspect of the present disclosure is to provide a laser-light-source module including a diffuser and a laser light source. The laser light source is disposed at a side of the diffuser, and the first substrate of the diffuser is located between the laser light source and the gel layer.

An aspect of the present disclosure is to provide a method for manufacturing a diffuser, and the method includes following steps. A surface treatment is performed with a surface of a first glass substrate, so as to make the surface of the first glass substrate form a first concave-convex surface. A gel layer is disposed on the first concave-convex surface of the first glass substrate, so as to make the gel layer have at least one first microstructure corresponding to the shape of the first concave-convex surface.

In some embodiments, the method further includes a step that removing the gel layer from the first glass substrate and then disposing the gel layer on a substrate, in which a body of the gel layer faces the substrate.

In some embodiments, the method further includes following steps. A surface treatment is performed with a surface of a second glass substrate, so as to make the surface of the second glass substrate form a second concave-convex surface. The second glass substrate is disposed on a surface of the gel layer, in which the surface of the gel layer is free from the first glass substrate, so as to make the gel layer have at least one second microstructure corresponding to the shape of the second concave-convex surface and facing toward the second concave-convex surface.

In some embodiments, the method further includes a step that disposing the gel layer on a substrate. The step of disposing the gel layer on the substrate is performed before the step of disposing the gel layer on the first concave-convex surface of the first glass substrate, in which the gel layer is located between the substrate and the first glass substrate after the step of disposing the gel layer on the first concave-convex surface of the first glass substrate.

In some embodiments, the surface treatment includes at least one of the group of an etching process, a sand-blasting process, and a laser-treatment process.

In some embodiments, the method further includes a step that curing the gel layer disposed on the first glass substrate.

DETAILED DESCRIPTION

Figure 1A:
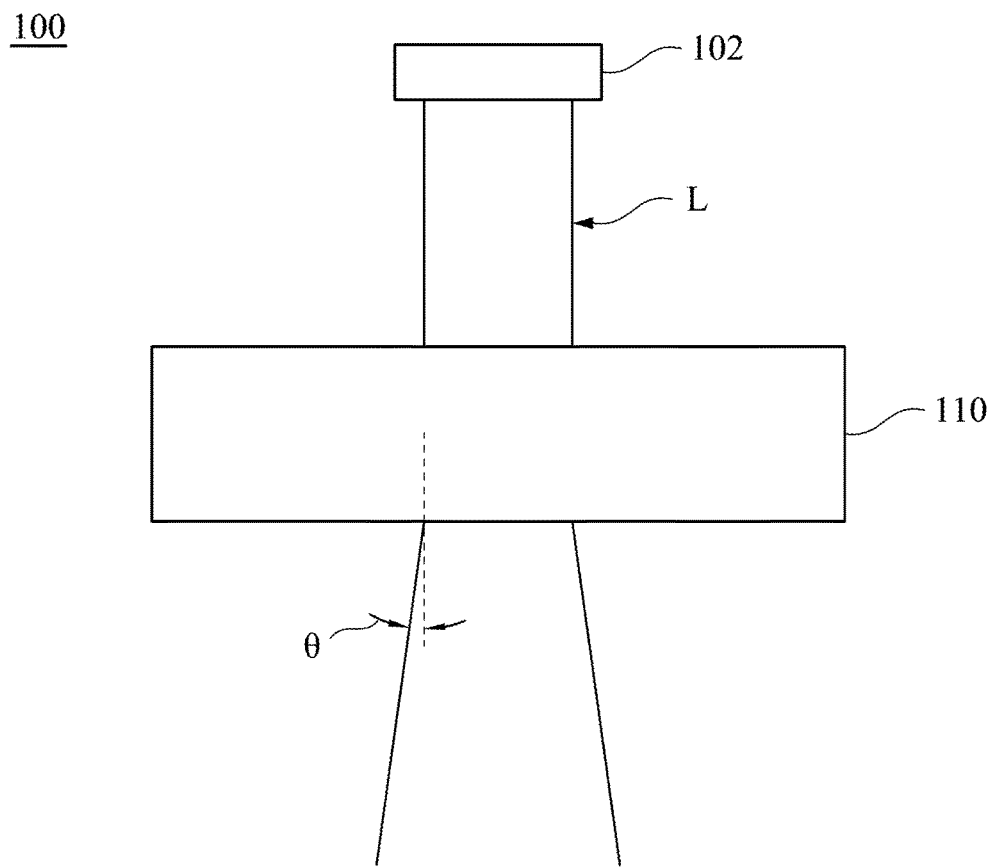
FIG. 1A is a schematic diagram showing a configuration of a laser-light-source module according to a first embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

It will be understood that, although the terms first, second, third etc. may be used herein to describe various elements, components, regions, layers and/or sections, these elements, components, regions, layers and/or sections should not be limited by these terms.

In order to provide a laser light beam having a smaller diffusing angle, an aspect of the present disclosure is to provide a laser-light-source module including a laser light source and a diffuser. The diffuser includes a gel layer, in which a laser light beam can be diffused by microstructures of the gel layer. In addition, the diffusing angle of the laser light beam can be adjusted by the configuration of the refractive indexes of layers or elements in the diffuser, such that the diffusing angle of the laser light beam can be set to satisfy a predetermined condition. With the configuration of the refractive indexes of layers in the diffuser, the microstructures of the gel layer can be allowed to have a greater roughness range, such that the processes for manufacturing the microstructures can be simplified, thereby reducing the manufacturing cost of the diffuser.

Figure 1B:
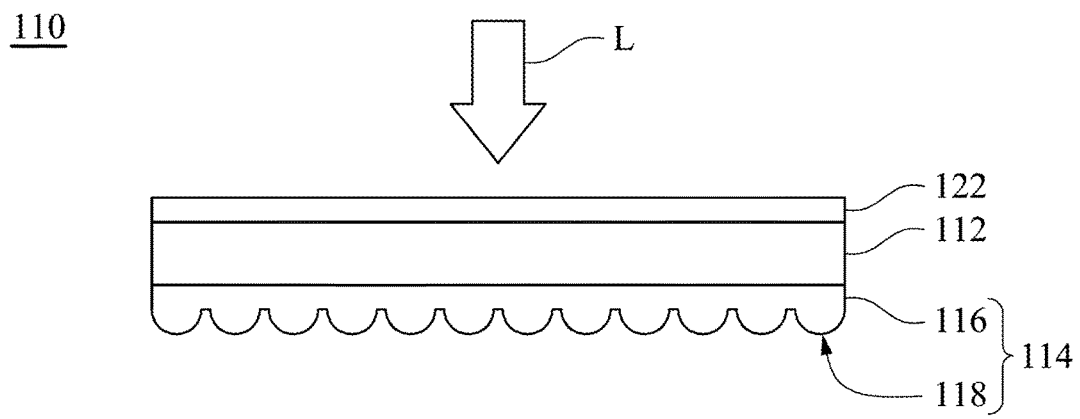
FIG. 1B is a schematic side view of a diffuser of the laser-light-source module illustrated in FIG. 1A.

FIG. 1A is a schematic diagram showing a configuration of a laser-light-source module 100 according to a first embodiment of the present disclosure. FIG. 1B is a schematic side view of a diffuser 110 of the laser-light-source module 100 illustrated in FIG. 1A. A laser-light-source module 100 includes a laser light source 102 and a diffuser 110. The laser light source 102 is disposed at a side of the diffuser 110 and provides a laser light beam L projecting toward the diffuser 110. In other words, the diffuser 110 is present within an illumination range of the laser light source 102. In order not to make FIG. 1B too complicated, the laser light beam L illustrated in FIG. 1B is expressed as an arrow, in which the traveling direction of the laser light beam L is also pointed out by the arrow. The diffuser 110 can be configured to receive and diffuse the laser light beam L. After the diffusing, the diffuser 110 can make the laser light beam L have a diffusing angle 9 relative to main direction of the laser light beam L before the diffusing. Thus, the laser light beam L after the diffusing is deflected to slant at the diffusing angle 9 with the laser light beam L before the diffusing. In some embodiments, the diffuser 110 is a small-angle diffusion element, so as to make the laser light beam L after the diffusing able to have a diffusing angle θ which may be smaller than 2 degrees.

The diffuser 110 is a multi-layered, composited, structure at least including a first substrate 112 and a gel layer 114, in which the first substrate 112 is located or disposed between the laser light source 102 and the gel layer 114. Thus, the first substrate 112 is taken as a light-inlet side element of the diffuser 110 facing the laser light source 102. The first substrate 112 has a first refractive index n1. The gel layer 114 includes a body 116 and at least one microstructure 118. The body 116 is disposed on the first substrate 112. In this embodiment, the first substrate 112 includes a body 116 and a plurality of microstructures 118. The microstructures 118 are disposed on the body 116, in which the microstructures 118 are located at a side of the body 116 opposite to the first substrate 112. Thus, the body 116 is located between the microstructures 118 and the first substrate 112. The dimension of each of the microstructures 118 is smaller than the dimension of the body 116. More specifically, a thickness of each of the microstructures 118 viewed in the FIG. 1B is smaller than thickness of the body 116. In some embodiments, the number of the microstructures 118 can be one or more than one. The microstructures 118 are distributed over a surface of the body 116, and the surface of the body 116 faces away from the first substrate 112. For example, the microstructures 118 can include one or few particulate structures or shapes, in which the one or few particulate structures or shapes protrude from the body 116 toward the direction facing away from the first substrate 112. In addition, the one or few particulate structures or shapes may be irregular. For example, the body 116 and the microstructures 118 can be formed in one integral piece, i.e., formed integrally. Thus, the body 116 and the microstructures 118 are formed from the same bulk material or formed by blending or adhering or suitable manners. In addition, the gel layer 114 has a second refractive index n2, in which n1>n2> the refractive index of air. In this regard, under a condition that standard atmospheric pressure and zero degrees Celsius, the refractive index of air is approximate equal to 1. The details about this property can refer to Optics, Fourth Edition. Pearson Higher Education. 18 Mar. 2003. ISBN 9780321188786.

Under this configuration, the laser light beam L provided by the laser light source 102 can be diffused by a difference between the refractive indexes of layers in the diffuser 110 and the microstructures 118 of the gel layer 114, such that the cross-sectional area of the laser light beam L before entering the diffuser 110 is smaller than the cross-sectional area of the laser light beam L after departing from the diffuser 110. On the other hand, since the second refractive index n2 of the gel layer 114 is in the range between the first refractive index n1 of the first substrate 112 and the refractive index of the air (which is equal to 1 under the suitable condition), the gel layer 114 can be taken as an optical buffer layer. In other words, with the second refractive index n2 of the gel layer 114, the larger difference between the first refractive index n1 of the first substrate 112 and the refractive index of the air can be buffered, thereby converging the diffusing angle θ. Thus, with the difference between the refractive indexes of the layers in the diffuser 110 and the configuration of the first substrate 112 in the optical path of the laser light beam L, the laser light beam L departing from the diffuser 110 can be converged, such that the diffusing angle θ of the laser light beam L departing from the diffuser 110 can easily satisfy the predetermined condition. For example, the diffusing angle θ of the laser light beam L departing from the diffuser 110 can be allowed to be smaller than 2 degrees.

In addition, since the first refractive index n1 of the first substrate 112 is different from the second refractive index n2 of the gel layer 114, a hetero-junction interface is formed at the joined surface between the first substrate 112 and the gel layer 114. Therefore, in the diffuser 110, the laser light beam L may correspond to the different refractive indexes with the different locations of the optical path thereof. With the configuration having the difference of the refractive indexes therein, the roughness range of the microstructures 118 of the gel layer 114 can be allowed to be greater. For example, under a condition in which the diffusing angle θ of the laser light beam L departing from the diffuser 110 is set as 2 degrees, the roughness of the microstructures 118 of the gel layer 114 having the refractive index different from that of the first substrate 112 can be greater than the roughness of the hetero-junction interface of another diffuser which does not have microstructures having the refractive index different from that of a first substrate. In this regard, since the roughness range of the microstructures 118 is relative to the processes for manufacturing the same, a fine roughness range may be formed by more complicated processes in necessity. Therefore, in the present embodiment, as the hetero-junction interface with the difference between the refractive indexes is set in the diffuser 110, the processes for manufacturing the microstructures 118 of the present embodiment can be simplified to be simpler than the conventional processes. For example, a complicated etching process or a laser engraving process can be omitted, thereby reducing the manufacturing cost of the diffuser 110.

The first substrate 112 can be made of an inorganic material, in which the inorganic material includes or selects at least one of silicon oxide, glass, quartz, calcium fluoride and sapphire. The gel layer 114 can be made of an organic material, in which the organic material includes at least one of polysiloxanes and silicone. Furthermore, a relationship between the first refractive index n1 and the second refractive index n2 may be further set as n1>n2>(n1+1)/2. For example, the first substrate 112 can be made of a glass material with a refractive index of 1.5, the gel layer 114 can be made of a silicone material with a refractive index of 1.4, and in which 1.5>1.4<(1.5+1)/2.

The diffuser 110 further includes a first anti-reflection layer 122. The first anti-reflection layer 122 is disposed on the first substrate 112, in which the first anti-reflection layer 122 is located at a side of the first substrate 112 which is opposite to the gel layer 114. In other words, the first substrate 112 is located between the first anti-reflection layer 122 and the gel layer 114. With the first anti-reflection layer 122, the reflection possibility of the laser light beam L before entering the diffuser 110 can be further reduced, thereby increasing the amount of light departing the diffuser 110. Furthermore, in order to achieve other optical effects, some coatings or optic components with suitable properties may disposed on the first substrate 112, for example, a dichroic, an antistatic layer, a filter or a scratch-resistant coating.

As described above, the diffuser of the present embodiment can diffuse the laser light beam and allow the laser light beam to have the smaller diffusing angle through the configuration of the refractive indexes of the layers in the diffuser. With the configuration, the microstructures of the gel layer can have the greater roughness range, such that the processes for manufacturing the microstructures can be simplified, thereby reducing the manufacturing cost of the diffuser. A method for manufacturing the diffuser of the present embodiment is described in the following with FIGS. 2A to 2D, in which FIGS. 2A to 2D are schematic cross-sectional views of the diffuser 110 illustrated in FIG. 1B at different intermediate stages of a method for manufacturing the same.

Figure 2A:
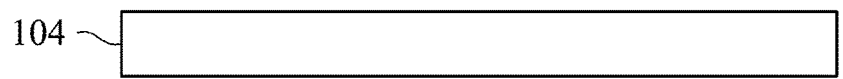
FIGS. 2A to 2D are schematic cross-sectional views of the diffuser illustrated in FIG. 1B at different intermediate stages of a method for manufacturing the same.
Figure 2B:
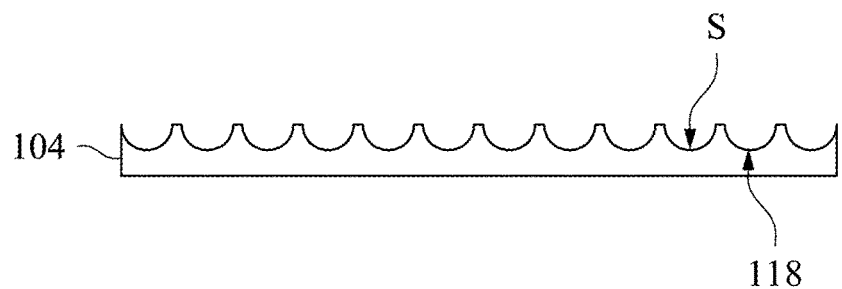

In FIGS. 2A and 2B, a surface treatment can be performed with a surface of a glass substrate 104, so as to make the surface of the glass substrate 104 become or form a concave-convex surface S. FIG. 2A shows the schematic diagram of the glass substrate 104 before the surface treatment is performed, and FIG. 2B shows the schematic diagram of the glass substrate 104 after the surface treatment is performed. The surface treatment performed with the surface of the glass substrate 104 may include at least one of an etching process, a sand-blasting process, and a laser-treatment process. After the surface treatment, the penetration rate of the glass substrate 104 is in a range from 50% to 95%. In the present embodiment, a sand-blasting process is performed with the glass substrate 104 illustrated in FIG. 2B. After the sand-blasting process is performed with the surface of the glass substrate 104, the surface of the glass substrate 104 performed may have a particulate concave-microstructure, so as to form the concave-convex surface S. In other words, the shape of the concave-convex surface S is shown as rise and fall, and the concave-convex surface S has various concave microstructures.

Figure 2C:
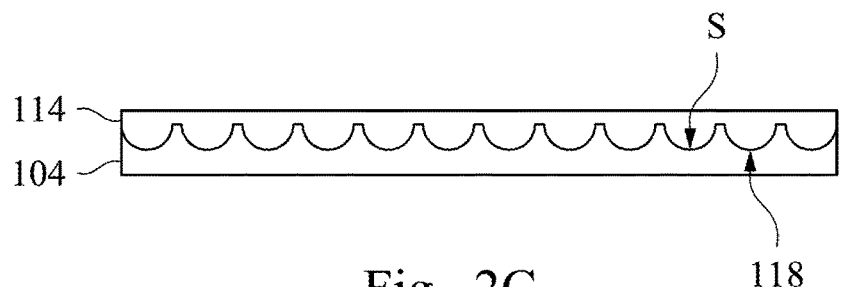
Figure 2D:

In FIGS. 2C and 2D, a gel layer 114 can be disposed on the concave-convex surface S of the glass substrate 104, so as to make the gel layer 114 have at least one microstructure 118 corresponding to the shape of the concave-convex surface S. Thus, a part of the gel layer 114 may be squeezed into the concave-convex surface S with corresponding to the various concave microstructures through the pressure, so as to form the microstructures 118 corresponding to the shape of the concave-convex surface S. Then, the gel layer 114 disposed on the performed glass substrate 104 can be cured, so as to cure the shape of the microstructures 118 formed between the gel layer 114 and the concave-convex surface S. After the gel layer 114 is cured, the gel layer 114 can be removed from the glass substrate 104. Thus, the gel layer 114 is removed from the joined surface at the concave-convex surface S of the glass substrate 104 which has been performed by the surface treatment. In other words, the glass substrate 104 can be taken as a mold such that the microstructures 118 of the gel layer 114 formed from the mold can correspond to the concave microstructures of the concave-convex surface S. Therefore, with performing the surface treatment with the surface of the glass substrate 104, the roughness of the microstructures 118 can be pre-controlled, and thus the microstructures 118 formed by mold can have the penetration rate in a range from 50% to 95%. Furthermore, the microstructures 118 can also be formed by an etching process, a sand-blasting process or a laser-treatment process. For example, the microstructures 118 of the gel layer 114 are protruding structures. After the gel layer 114 with the microstructures 118 are removed from the glass substrate 104, the gel layer 114 can be disposed on the first substrate 112 (see FIG. 1B), in which the microstructures 118 of the gel layer 114 are opposite to the first substrate 112. More specifically, the body 116 of the gel layer 114 is located between the first substrate 112 and the microstructures 118. Next, the first anti-reflection layer 122 (see FIG. 1B) can be disposed on the first substrate 112, and then the diffuser 110 illustrated in FIG. 1B can be obtained. In addition, the step in which disposing the first anti-reflection layer 122 can be brought to be earlier than the step in which disposing the gel layer 114 on the first substrate 112.

Figure 3:
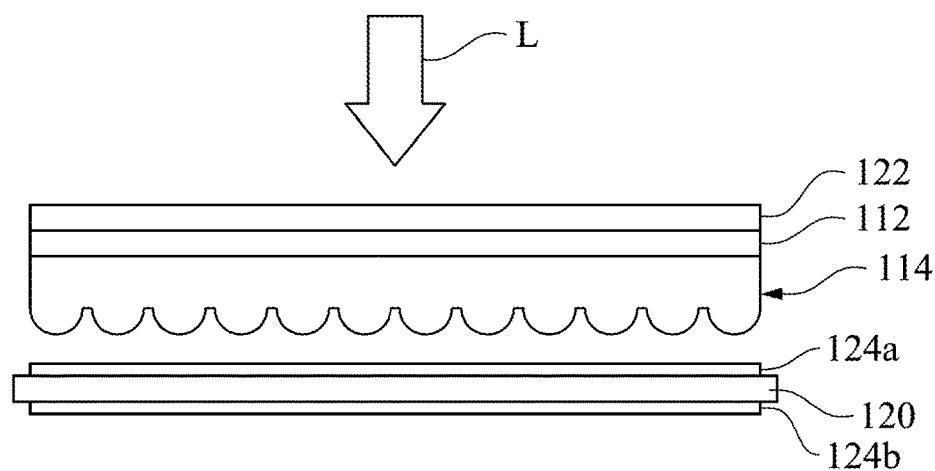
FIG. 3 is a schematic side view of a diffuser according to a second embodiment of the present disclosure.

FIG. 3 is a schematic side view of a diffuser 110 according to a second embodiment of the present disclosure. The laser light beam L illustrated in FIG. 3 is expressed as an arrow, in which the traveling direction of the laser light beam L is pointed out by the arrow. At least one difference between the present embodiment and the first embodiment is that the diffuser 110 further includes a second substrate 120. The second substrate 120 is located at a side of the gel layer 114, in which the first substrate 112 and the second substrate 120 are located at opposite sides of the gel layer 114. In other words, the gel layer 114 is located between the first substrate 112 and the second substrate 120. The second substrate 120 is separated from the gel layer 114 by a distance, such that the second substrate 120 does not directly contact the gel layer 114. The first substrate 112 and the second substrate 120 have substantially the same refractive index. Thus, the refractive indexes of the first substrate 112 and the second substrate 120 are both greater than the refractive index of the gel layer 114. In the present embodiment, the second substrate 120 can be used as a protect layer, thereby providing the gel layer 114 with a dust-proof or water-proof effect. In addition, similar to the configuration of the first substrate 112 as described previously, some optical coating or optical components can be disposed on the second substrate 120 in the present embodiment.

Furthermore, the second substrate 120 can be used as a carrier board, such that an optical component can be disposed on the second substrate 120. For example, in addition to the first anti-reflection layer 122, the diffuser 110 can further include two second anti-reflection layers 124a and 124b. The second anti-reflection layer 124a is disposed at a side of the second substrate 120 and is located between the gel layer 114 and the second substrate 120. The second anti-reflection layer 124b is disposed at another side of the second substrate 120, and the second substrate 120 is located between the second anti-reflection layer 124b and the gel layer 114. In other words, the second anti-reflection layers 124a and 124b are respectively located at two opposite sides of the second substrate 120, in which the second anti-reflection layer 124a is relatively close to the gel layer 114, and the second anti-reflection layer 124b is relatively far from the gel layer 114. Under this configuration, since the number of the anti-reflection layers is increased, the amount of the light provided by the diffuser 110 can be improved.

Figure 4:
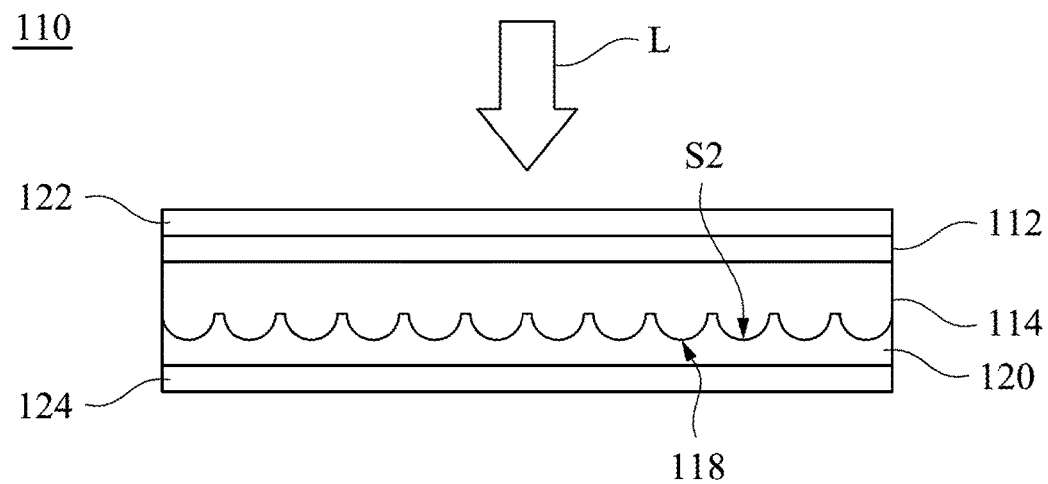
FIG. 4 is a schematic side view of a diffuser according to a third embodiment of the present disclosure.

FIG. 4 is a schematic side view of a diffuser 110 according to a third embodiment of the present disclosure. The laser light beam L illustrated in FIG. 4 is expressed as an arrow, in which the traveling direction of the laser light beam L is pointed out by the arrow. At least one difference between the present embodiment and the second embodiment is that the second substrate 120 is in contact with the gel layer 114. Thus, the gel layer 114 disposed between the first substrate 112 and the second substrate 120 is in contact with both the first substrate 112 and the second substrate 120, and the second substrate 120 is not separated from the gel layer 114 by a distance.

In the present embodiment, the second substrate 120 has a concave-convex surface S2. The concave-convex surface S2 of the second substrate 120 faces toward the microstructures 118 of the gel layer 114, and at least one of the microstructures 118 of the gel layer 114 is filled into the concave-convex surface S2 of the second substrate 120. More specifically, the microstructures 118 of the gel layer 114 are formed by corresponding to the shape of the concave-convex surface S2 of the second substrate 120, and therefore the shape of the microstructures 118 of the gel layer 114 and the shape of the concave-convex surface S2 of the second substrate 120 are complementary. For example, the concave-convex surface S2 of the second substrate 120 has the particulate concave-microstructures, and the microstructures 118 of the gel layer 114 are protruding structures filled into the concave-microstructures of the concave-convex surface S2 of the second substrate 120

The substrates which located at two opposite sides of the gel layer 114 (that means, the first substrate 112 and the second substrate 120) respectively have the first refractive index n1 and a third refractive index n3, which are both greater than the second refractive index n2 of the gel layer 114, in which n1>n2 and n3>n2. Therefore, the concave-convex surface S2 having the concave-microstructures of the second substrate 120 can provide a diverging effect as a concave lens. In some embodiment, the first refractive index n1 and the third refractive index n3 can be substantially the same. Therefore, with the diverging effect provided by the concave-convex surface S2, the microstructures 118 of the gel layer 114 can be allowed to be manufactured in the greater roughness range. In other words, under the condition in which the diffusing angle θ (see FIG. 1A) of the laser light beam L departing from the diffuser 110 is set as 2 degrees, the microstructures 118 of the present embodiment can have the greater allowable range of the roughness, such that the processes for manufacturing the microstructures 118 can be further simplified, thereby reducing the manufacturing cost of the diffuser 110.

Furthermore, in the present embodiment, the second substrate 120 can also be used as a carrier board, such that an optical component can be disposed on the second substrate 120. Similar to the second embodiment, in addition to the first anti-reflection layer 122, the diffuser can further include the second anti-reflection layer. The second anti-reflection layer 124 is disposed on the second substrate 120, in which the second anti-reflection layer 124 is opposite to the gel layer 114, thereby improving the amount of the light departing the diffuser 110. In other words, the second substrate 120 is located between the second anti-reflection layer 124 and the gel layer 114.

Figure 5A:
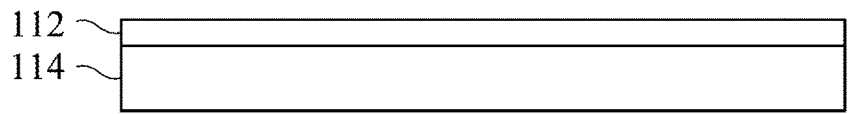
FIGS. 5A to 5C are schematic cross-sectional views of the diffuser illustrated in FIG. 4 at different intermediate stages of a method for manufacturing the same.
Figure 5B:
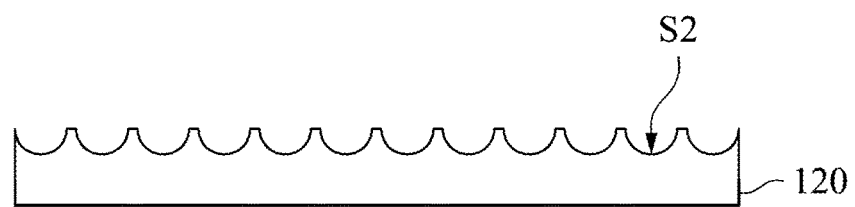
Figure 5C:
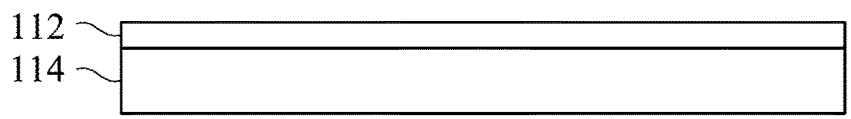
Figure 5C:
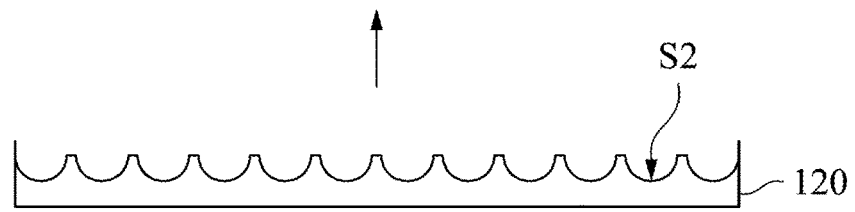

As described previously, the microstructures of the gel layer can be formed by the concave-convex surface of the second substrate. A method for manufacturing the diffuser of the present embodiment is described in the following with FIGS. 5A to 5C. FIGS. 5A to 5C are schematic cross-sectional views of the diffuser 110 illustrated in FIG. 4 at different intermediate stages of a method for manufacturing the same.

In FIG. 5A, the gel layer 114 can be disposed on the first substrate 112, in which the gel layer 114 may not have microstructures yet (as the microstructures 118 illustrated in FIG. 4). In FIG. 5B, a surface treatment can be performed with a surface of a second substrate 120, so as to make the surface of the second substrate 120 form a concave-convex surface S2. In the present embodiment, the second substrate 120 can be made of a glass material, and the treatment performed with the second substrate 120 is, for example, a sand-blasting process. With the sand-blasting process, the concave-convex surface S2 of the second substrate 120 can have the particulate concave-microstructure.

In FIG. 5C, the second substrate 120 performed can be disposed on the gel layer 114 along the direction of the arrow, in which the second substrate 120 is opposite to the first substrate 112. Thus, the gel layer 114 is located between the first substrate 112 and the second substrate 120. With the concave-convex surface S2 of the second substrate 120, at least a part of the gel layer 114 can be squeezed into the concave-convex surface S2 of the second substrate 120, so as to make the gel layer 114 have the microstructures (as the microstructures 118 illustrated in FIG. 4). As previously described, the microstructures of the gel layer 114 are protruding structures filled into the concave-microstructure of the concave-convex surface S2 of the second substrate 120, in which the microstructures of the gel layer 114 face toward the concave-convex surface S2 of the second substrate 120. In other words, the microstructures of the gel layer 114 can be formed by an imprinting process. After the microstructures of the gel layer 114 are formed, the first anti-reflection layer 122 and the second anti-reflection layer 124 can be respectively formed on the first substrate 112 and the second substrate 120, in which each of the first anti-reflection layer 122 and the second anti-reflection layer 124 is opposite to the gel layer 114. Then, the diffuser illustrated in FIG. 4 can be obtained.

Figure 6:
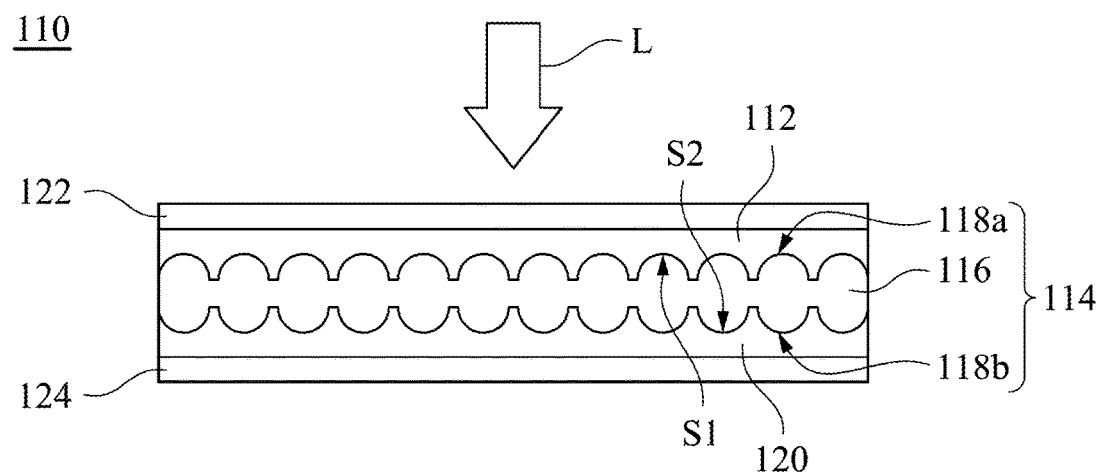
FIG. 6 is a schematic side view of a diffuser according to a fourth embodiment of the present disclosure.

FIG. 6 is a schematic side view of a diffuser 110 according to a fourth embodiment of the present disclosure. The laser light beam L illustrated in FIG. 6 is expressed as an arrow, in which the traveling direction of the laser light beam L is pointed out by the arrow. At least one difference between the present embodiment and the third embodiment is that the first substrate 112 has a concave-convex surface S1, in which the concave-convex surface S1 of the first substrate 112 faces toward the gel layer 114, as the following descriptions.

In the present embodiment, the body 116 of the gel layer 114 has a top surface and a bottom surface. The top surface of the body 116 faces toward the concave-convex surface S1 of the first substrate 112, and the bottom surface of the body 116 faces toward the concave-convex surface S2 of the second substrate 120. Microstructures 118a of the gel layer 114 are disposed at the top surface of the body 116, and microstructures 118b of the gel layer 114 are disposed at the bottom surface of the body 116. In the configuration of the microstructures of the gel layer 114, the microstructures 118a disposed on the top surface of the body 116 are correspondingly filled into the concave-convex surface S1 of the first substrate 112, and the microstructures 118b disposed on the bottom surface of the body 116 are correspondingly filled into the concave-convex surface S2 of the second substrate 120. In other words, the microstructures 118a and the microstructures 118b are respectively disposed on two opposite surfaces of the body 116. Explained in a different way, the top surface and the bottom surface of the gel layer 114 are only respectively adjacent to the first substrate 112 and the second substrate 120, in which the microstructures 118a correspond to the concave-convex surface S1 of the first substrate 112 and the microstructures 118b correspond to the concave-convex surface S2 of the second substrate 120. Furthermore, the diffuser 110 can further include the first anti-reflection layer 122 and the second anti-reflection layer 124. The first anti-reflection layer 122 and the second anti-reflection layer 124 can be respectively disposed on the first substrate 112 and the second substrate 120, in which each of the first anti-reflection layer 122 and the second anti-reflection layer 124 is opposite to the gel layer 114, thereby improving the amount of the light departing the diffuser 110.

With the microstructures 118a and 118b disposed on two opposite surfaces of the body 116, the diffuser 110 can further provide the diverging effect through the gel layer 114, such that the microstructures 118a and 118b can have the greater allowable range of the roughness. Therefore, the process for manufacturing the microstructures 118a and 118b can be simplified, thereby reducing the manufacturing cost of the diffuser 110. In addition, as the descriptions mentioned in the third embodiment, the concave-convex surface S1 of the first substrate 112 and the concave-convex surface S2 of the second substrate 120 which can be taken as a concave-lens structure and can further provide the diverging effect, such that the microstructures 118a and 118b can be allowed to been manufactured in the even greater allowable ranges of roughness.

The process for manufacturing the diffuser 110 of the present embodiment is similar to that of the third embodiment. Thus, the surface treatment can be performed with the surface of the first substrate 112, for example, performing a sand-blasting process, such that the first substrate 112 can have the concave-convex surface S1. Next, the gel layer 114 can be disposed on the concave-convex surface S1 of the first substrate 112, so as to form the microstructures 118a on the top surface of the body 116 of the gel layer 114. After the gel layer 114 is disposed on the concave-convex surface S1 of the first substrate 112, the manufacturing processes illustrated in FIGS. 5A to 5C can be performed, in which the following surface treatment is performed with the surface of the second substrate 120. For example, a sand-blasting process is performed with the surface of the second substrate 120 to make the second substrate have the concave-convex surface S2. Next, the surface of the gel layer 114 which is not adjacent to the first substrate 112 can disposed on the concave-convex surface S2 of the second substrate 120. Thus, the bottom surface of the body 116 can be disposed on the concave-convex surface S2 of the second substrate 120, so as to form the microstructures 118b on the bottom surface of the body 116 of the gel layer 114. Accordingly, the microstructures 118a and 118b can be respectively formed on the top surface and the bottom surface of the body 116 of the gel layer 114, and the diffuser 110 illustrated in FIG. 6 can be obtained.

As described above, the laser-light-source module of the present disclosure includes the laser light source and the diffuser. The diffuser includes the gel layer, in which the laser light beam can be diffused by the microstructures of the gel layer. In addition, the diffusing angle of the laser light beam can be adjusted by the configuration of the refractive indexes of the layers in the diffuser, such that the diffusing angle of the laser light beam can be set to satisfy the predetermined condition. After the laser light beam is diffused by the diffuser, the laser light beam can have the smaller diffusing angle. With the configuration of the refractive indexes of the layers in the diffuser, the microstructures of the gel layer can be allowed to have the greater roughness range, such that the processes for manufacturing the microstructures can be simplified, thereby reducing the manufacturing cost of the diffuser. Furthermore, the microstructure of the gel layer can be formed by the mold, in which the mold is the concave-convex surface formed from the glass substrate which is performed by surface treatment such as the sand-blasting process. The formation of the microstructure of the gel layer includes forming through the mold and directly forming through the imprinting process.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the invention. In view of the foregoing, it is intended that the present disclosure cover modifications and variations of the present disclosure provided they fall within the scope of the following claims.

What is claimed is:

1. A diffuser, comprising:
   a first substrate having a first refractive index n1; and
   a gel layer comprising:
      a body disposed on the first substrate; and
      at least one microstructure disposed on the body, wherein the dimension of the microstructure is smaller than the dimension of the body, the body is located between the microstructure and the first substrate, the microstructure comprises at least one particulate structure protruding from the body in a direction away from the first substrate, the gel layer has a second refractive index n2, and n1>n2.

2. The diffuser of claim 1, further comprising:
   a first anti-reflection layer disposed on the first substrate, wherein the first substrate is located between the first anti-reflection layer and the gel layer.

3. The diffuser of claim 1, wherein a relationship between the first refractive index n1 and the second refractive index n2 is n1>n2>(n1+1)/2.

4. The diffuser of claim 2, further comprising:
   a second substrate, wherein the gel layer is located between the first substrate and the second substrate.

5. The diffuser of claim 4, wherein the first substrate and the second substrate have substantially the same refractive index.

6. The diffuser of claim 4, wherein the second substrate has a concave-convex surface facing toward the microstructure of the gel layer, and the microstructure of the gel layer is filled into the concave-convex surface of the second substrate.

7. The diffuser of claim 6, wherein the first substrate has a concave-convex surface facing toward the gel layer, and the gel layer comprises a plurality of the microstructures, wherein one part of the microstructures is filled into the concave-convex surface of the first substrate, and another part of the microstructures is filled into the concave-convex surface of the second substrate.

8. The diffuser of claim 4, further comprising:
   a second anti-reflection layer, wherein the second substrate is located between the second anti-reflection layer and the gel layer.

9. The diffuser of claim 4, further comprising:
   a second anti-reflection layer, wherein the second anti-reflection layer is located between the second substrate and the gel layer.

10. The diffuser of claim 1, wherein the first substrate is made of an inorganic material comprising at least one of the group of silicon oxide, glass, quartz, calcium fluoride and sapphire, wherein the gel layer is made of an organic material comprising at least one of the group of polysiloxanes and silicone.

11. The diffuser of claim 1, wherein the body and the microstructure of the gel layer are formed integrally.

12. A laser-light-source module, comprising:
   a diffuser, comprising:
      a first substrate having a first refractive index n1; and
      a gel layer comprising:
         a body disposed on the first substrate; and
         at least one microstructure disposed on the body, wherein the dimension of the microstructure is smaller than the dimension of the body, the body is located between the microstructure and the first substrate, the microstructure comprises at least one particulate structure protruding from the body in a direction away from the first substrate, the gel layer has a second refractive index n2, and n1>n2; and
   a laser light source disposed at a side of the diffuser, wherein the first substrate of the diffuser is located between the laser light source and the gel layer.

13. The diffuser of claim 12, wherein a relationship between the first refractive index n1 and the second refractive index n2 is n1>n2>(n1+1)/2.

14. The diffuser of claim 12, wherein the body and the microstructure of the gel layer are formed integrally.

* * * * *